(12) United States Patent
Tokioka et al.

(10) Patent No.: US 8,507,310 B2
(45) Date of Patent: Aug. 13, 2013

(54) METHOD FOR MANUFACTURING THIN-FILM PHOTOELECTRIC CONVERSION DEVICE

(75) Inventors: Hidetada Tokioka, Tokyo (JP); Hiroya Yamarin, Tokyo (JP); Tae Orita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 120 days.

(21) Appl. No.: 13/129,612

(22) PCT Filed: Nov. 20, 2009

(86) PCT No.: PCT/JP2009/069724
§ 371 (c)(1),
(2), (4) Date: May 17, 2011

(87) PCT Pub. No.: WO2010/064549
PCT Pub. Date: Jun. 10, 2010

(65) Prior Publication Data
US 2011/0223709 A1    Sep. 15, 2011

(30) Foreign Application Priority Data

Dec. 4, 2008  (JP) ................ 2008-310266

(51) Int. Cl.
*H01L 21/00*    (2006.01)
*H01L 31/042*   (2006.01)
(52) U.S. Cl.
USPC ....... 438/73; 257/E31.032; 136/244; 136/252
(58) Field of Classification Search
USPC ........ 438/73, 48, 57; 257/E31.032; 136/244
See application file for complete search history.

(56) References Cited

U.S. PATENT DOCUMENTS 4,862,227 A    8/1989  Tsuge et al.
4,872,925 A *  10/1989 McMaster ................ 136/244
(Continued)

FOREIGN PATENT DOCUMENTS

JP  59 168680   9/1984
JP  61 198685   9/1986
(Continued)

OTHER PUBLICATIONS

U.S. Appl. No. 13/256,813, filed Sep. 15, 2011, Tokioka, et al.
(Continued)

*Primary Examiner* — Leonard Chang
(74) *Attorney, Agent, or Firm* — Oblon, Spivak, McClelland, Maier & Neustadt, L.L.P.

(57) ABSTRACT

A method for manufacturing a thin-film photoelectric conversion device includes forming a first electrode layer, a photoelectric conversion layer having three conductive semiconductor layers laminated thereon, and a second electrode layer sequentially laminated in this order on a translucent insulating substrate, such that adjacent thin-film photoelectric conversion cells are electrically connected in series, isolating a thin-film photoelectric conversion cell into a plurality of thin-film photoelectric conversion cells by forming isolation trenches that reach from the second electrode layer to the first electrode layer, removing a part of sidewalls at an external periphery of the thin-film photoelectric conversion cells positioned at an external peripheral edge of the thin-film photoelectric conversion device, along with the external periphery, and modifying into insulation layers by performing an oxidation process on all of the sidewalls of the isolation trenches of the photoelectric conversion layer and all of the sidewalls at the external periphery.

13 Claims, 11 Drawing Sheets

(56) References Cited

U.S. PATENT DOCUMENTS

| | | | |
|---|---|---|---|
| 6,265,652 B1* | 7/2001 | Kurata et al. | 136/244 |
| 6,632,993 B2* | 10/2003 | Hayashi et al. | 136/256 |
| 6,717,200 B1* | 4/2004 | Schamberger et al. | 257/302 |
| 7,033,957 B1* | 4/2006 | Shiraiwa et al. | 438/770 |
| 2002/0119674 A1* | 8/2002 | Thakur | 438/758 |
| 2009/0056804 A1* | 3/2009 | Hishida | 136/256 |
| 2009/0065904 A1* | 3/2009 | Wang | 257/621 |
| 2011/0079272 A1 | 4/2011 | Tokioka et al. | |

FOREIGN PATENT DOCUMENTS

| | | |
|---|---|---|
| JP | 62 11280 | 1/1987 |
| JP | 63 122283 | 5/1988 |
| JP | 3 132080 | 6/1991 |
| JP | 7 211928 | 8/1995 |
| JP | 08 139351 | 5/1996 |
| JP | 08 330617 | 12/1996 |
| JP | 2002 261091 | 9/2002 |
| JP | 2002 280579 | 9/2002 |
| JP | 2007 234909 | 9/2007 |

OTHER PUBLICATIONS

International Search Report issued Jan. 26, 2010 in PCT/JP09/069724 filed Nov. 20, 2009.

Office Action mailed Mar. 12, 2013 in Japanese Patent Application No. 2010-541291 (with partial English Translation).

* cited by examiner

METHOD FOR MANUFACTURING THIN-FILM PHOTOELECTRIC CONVERSION DEVICE

FIELD

The present invention relates to a method for manufacturing a thin-film photoelectric conversion device, and more particularly relates to a method for manufacturing a thin-film photoelectric conversion device that has improved photoelectric conversion efficiency by preventing a side leakage on sidewall surfaces of isolation trenches for isolating cells.

BACKGROUND

A conventional thin-film solar cell module as a thin-film photoelectric conversion module includes thin-film solar battery cells each of which has a transparent electrode layer, a thin-film semiconductor layer as a photoelectric conversion layer, and a reflection conductive film as a back-surface electrode layer sequentially formed at one surface side of a substrate and generates photovoltaic power in the thin-film semiconductor layer by using light incident from the other surface side of the substrate, for example. A plurality of thin-film solar battery cells are electrically connected in series in a state that the thin-film solar battery cells are arranged at a predetermined distance between adjacent cells, thereby forming a thin-film solar cell module. Photoelectric conversion layers between adjacent thin-film solar battery cells are electrically isolated.

The thin-film solar cell module described above is manufactured in the following method. First, on a translucent insulating substrate on a surface of which a transparent electrode layer that has a texture structure having an uneven surface made of transparent conductive oxide (TCO) such as tin oxide ($SnO_2$) and zinc oxide (ZnO) is formed, the transparent electrode layer is processed in a stripe shape by disconnecting and removing by laser irradiation. The texture structure has a function of scattering sunlight incident to the thin-film solar cells and of increasing light utilization efficiency in thin-film semiconductor layers.

Next, a thin-film semiconductor layer for photoelectric conversion made of a material such as amorphous silicon is formed on the transparent electrode layer by a plasma CVD (chemical vapor deposition) method or the like. Thereafter, at a position different from a position where the transparent electrode layer is disconnected, the thin-film semiconductor layer is processed in a stripe shape by disconnecting and removing by laser irradiation.

Next, a back-surface electrode layer made of a light-reflective metal is formed on the thin-film semiconductor layer by a sputtering method or the like. Thereafter, at a position different from a position where the transparent electrode layer is disconnected, the back-surface electrode layer is again disconnected and removed by laser irradiation to process the back-surface electrode layer in a stripe shape.

According to such a thin-film solar cell module, a current leakage on a processed surface of a thin-film semiconductor layer as a photoelectric conversion layer becomes a problem. That is, the thin-film semiconductor layer is processed by removing a film by irradiating laser beams as described above. At this time, when the laser beam strength is low, a processed film is not completely blown off, and a short-circuit failure occurs due to a residue of the film between an electrode of a transparent electrode layer of one thin-film solar cell and an electrode of a back-surface electrode layer of this thin-film solar cell. On the other hand, when the laser beam strength is high, no residue of film is generated, but a sidewall as a processed surface end of the thin-film semiconductor layer is molten and crystallized. The crystallized sidewall has higher electric conductivity than that of the inside of a thin-film semiconductor, and thus a short-circuit failure occurs between a transparent electrode layer of a thin-film solar cell and a back-surface electrode layer of this thin-film solar cell. As a result, photoelectric conversion efficiency is degraded and thus power generation efficiency is degraded.

To solve the above problems, for example, there has been proposed a technique of suppressing a current leakage by achieving a process that does not generate any residue even when laser beams having low strength are irradiated, by forming a film that has different crystallinity at only a position corresponding to a laser-processed portion of a thin-film semiconductor layer by using a plasma CVD device having cyclical convexes in an anode electrode (see, for example, Patent Literature 1).

CITATION LIST

Patent Literature

Patent Literature 1: Japanese Patent Application Laid-open No. 2007-234909

SUMMARY

Technical Problem

However, according to the technique described in Patent Literature 1 mentioned above, crystallization on a processed end surface cannot be completely prevented even when a thin-film semiconductor layer is processed by irradiating laser beams having low strength. Accordingly, there is a problem that a current leakage occurs.

The present invention has been achieved in view of the above problem, and an object of the present invention is to obtain a method for manufacturing a thin-film photoelectric conversion device that can obtain high photoelectric conversion efficiency by preventing occurrence of a side leakage on sidewall surfaces of isolation trenches.

Solution to Problem

In order to solve the above-mentioned problems and to achieve the object, according to an aspect of the present invention, there is provided a method for manufacturing a thin-film photoelectric conversion device, the method including a first step of forming a first electrode layer, a photoelectric conversion layer having a first conductive semiconductor layer, a second conductive semiconductor layer, and a third conductive semiconductor layer sequentially laminated thereon, and a second electrode layer sequentially laminated in this order on a translucent insulating substrate, such that adjacent thin-film photoelectric conversion cells are electrically connected in series, a second step of isolating a thin-film photoelectric conversion cell into a plurality of thin-film photoelectric conversion cells by forming isolation trenches that reach from a surface of the second electrode layer to the first electrode layer, after the second step, a third step of removing a part of sidewalls at an external periphery of the thin-film photoelectric conversion cells positioned at an external peripheral edge of the thin-film photoelectric conversion device, along with an external periphery of the thin-film photoelectric conversion device, and a fourth step of modifying into insulation layers by performing an oxidation process on all of the sidewalls of the isolation trenches of the photoelectric conversion layer and all of the sidewalls at the external periphery after the third step.

Advantageous Effects of Invention

According to the present invention, a high-quality thin-film photoelectric conversion device having high photoelectric conversion efficiency can be obtained by preventing a side leakage current by forming insulation layers on sidewall surfaces of isolation trenches.

BRIEF DESCRIPTION OF DRAWINGS

FIG. 1-2 is an explanatory diagram of a cross-sectional structure of a thin-film solar battery cell according to the first embodiment of the present invention in a short direction.

FIG. 2-1 is a cross-sectional view for explaining an example of a manufacturing process of the thin-film solar cell module according to the first embodiment of the present invention.

FIG. 2-2 is a cross-sectional view for explaining an example of a manufacturing process of the thin-film solar cell module according to the first embodiment of the present invention.

FIG. 2-3 is a cross-sectional view for explaining an example of a manufacturing process of the thin-film solar cell module according to the first embodiment of the present invention.

FIG. 2-4 is a cross-sectional view for explaining an example of a manufacturing process of the thin-film solar cell module according to the first embodiment of the present invention.

FIG. 2-5 is a cross-sectional view for explaining an example of a manufacturing process of the thin-film solar cell module according to the first embodiment of the present invention.

FIG. 2-6 is a cross-sectional view for explaining an example of a manufacturing process of the thin-film solar cell module according to the first embodiment of the present invention.

FIG. 2-7 is a cross-sectional view for explaining an example of a manufacturing process of the thin-film solar cell module according to the first embodiment of the present invention.

FIG. 2-8 is a cross-sectional view for explaining an example of a manufacturing process of the thin-film solar cell module according to the first embodiment of the present invention.

FIG. 3 is an explanatory diagram of a cross-sectional structure of a thin-film solar battery cell according to a second embodiment of the present invention in a short direction.

FIG. 4-1 is a cross-sectional view for explaining an example of a manufacturing process of a thin-film solar cell module according to the second embodiment of the present invention.

FIG. 4-2 is a cross-sectional view for explaining an example of a manufacturing process of the thin-film solar cell module according to the second embodiment of the present invention.

FIG. 5 is a schematic diagram for explaining a method for irradiating oxygen ion beams on the thin-film solar cell module in a method for forming oxide layers according to the second embodiment.

FIG. 6 is an explanatory diagram of a cross-sectional structure of a thin-film solar battery cell according to a third embodiment of the present invention in a short direction.

FIG. 7-1 is a cross-sectional view for explaining an example of a manufacturing process of a thin-film solar cell module according to the third embodiment of the present invention.

FIG. 7-2 is a cross-sectional view for explaining an example of a manufacturing process of the thin-film solar cell module according to the third embodiment of the present invention.

DESCRIPTION OF EMBODIMENTS

Figure 1:
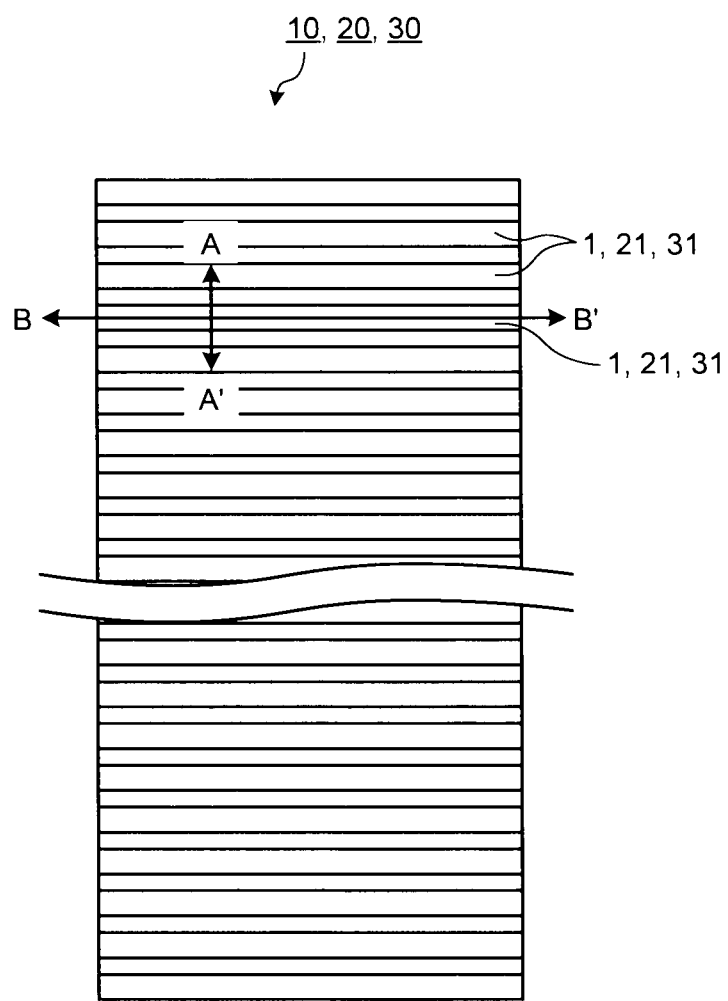
FIG. 1-1 is a plan view of a schematic configuration of a thin-film solar cell module according to a first embodiment of the present invention.

Exemplary embodiments of a method for manufacturing a thin-film photoelectric conversion device according to the present invention will be explained below in detail with reference to the accompanying drawings. The present invention is not limited to the following descriptions and various modifications can be appropriately made without departing from the scope of the invention. In the drawings explained below, scales of respective members may be shown differently from those in practice to facilitate understanding, and the same applies to the relationships between the drawings.

First Embodiment

Figures 1, 2:
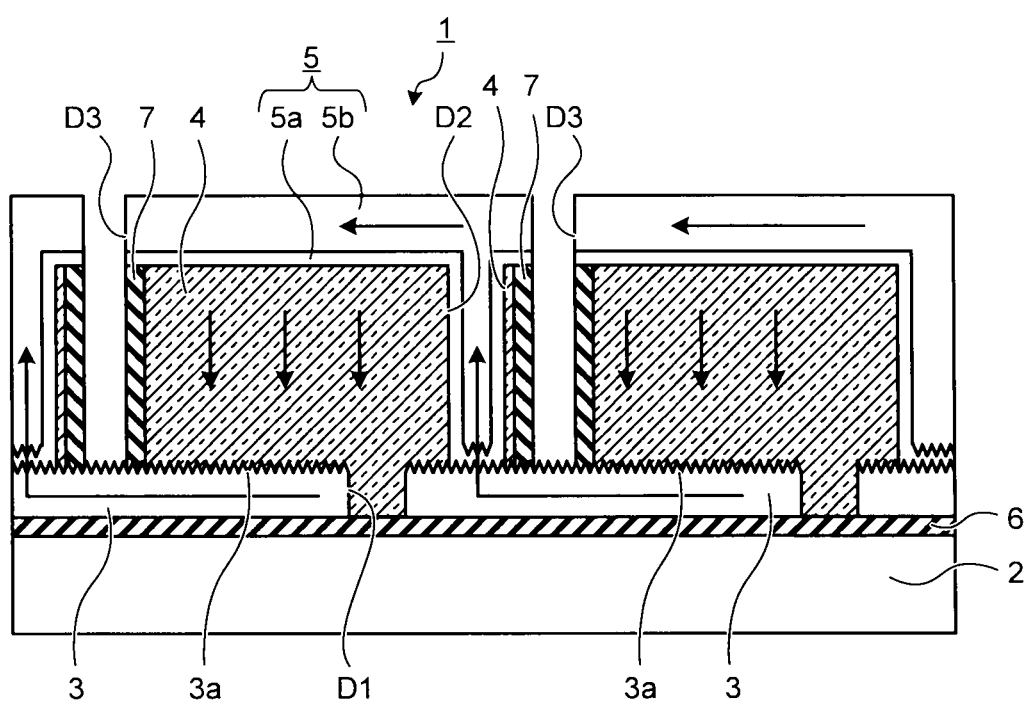

FIG. 1-1 is a plan view of a schematic configuration of a thin-film solar cell module (hereinafter, "module") 10 as a thin-film photoelectric conversion device according to a first embodiment of the present invention. FIG. 1-2 is an explanatory diagram of a cross-sectional structure of thin-film solar battery cells (hereinafter, also "cells") 1 as thin-film photoelectric conversion cells that constitute the module 10 in a short direction. FIG. 1-2 is a cross-sectional view of relevant parts along a line A-A' in FIG. 1-1.

As shown in FIGS. 1-1 and 1-2, the module 10 according to the first embodiment includes a plurality of reed-shaped (rectangular) cells 1 formed on a translucent insulating substrate 2, and has a structure that these cells 1 are electrically connected in series. As shown in FIG. 1-2, each of the cells 1 has a structure that has sequentially laminated the translucent insulating substrate 2, a transparent electrode layer 3 that becomes a first electrode layer and is formed on the translucent insulating substrate 2, a photoelectric conversion layer 4 as a thin-film semiconductor layer formed on the transparent electrode layer 3, and a back-surface electrode layer 5 that becomes a second electrode layer and is formed on the photoelectric conversion layer 4. As shown in FIG. 1-2, an undercoating layer 6 of silicon oxide (hereinafter, simply "$SiO_2$") is provided when necessary as an impurity inhibition layer on the translucent insulating substrate 2.

The transparent electrode layers 3 formed on the translucent insulating substrate 2 are formed with stripe first trenches D1 that are extended in a direction substantially parallel to a short direction of the translucent insulating substrate 2 and reach the translucent insulating substrate 2. The photoelectric conversion layers 4 are embedded into portions of the first trenches D1. Accordingly, the transparent electrode layers 3 are formed in isolation between cells such that the transparent electrode layers 3 stride over adjacent cells 1.

Further, the photoelectric conversion layers 4 formed on the transparent electrode layers 3 are formed with stripe second trenches (connection trenches) D2 that are extended in a direction substantially parallel to the short direction of the translucent insulating substrate 2 and reach the transparent electrode layers 3, at positions different from positions of the first trenches D1. The back-surface electrode layers 5 are embedded into portions of the second trenches (connection trenches) D2. As a result, the back-surface electrode layers 5 are connected to the transparent electrode layers 3. Because the transparent electrode layers 3 stride over adjacent cells 1, the back-surface electrode layer 5 of one of adjacent two cells is electrically connected to the other transparent electrode layer 3.

Furthermore, on the back-surface electrode layers 5 and the photoelectric conversion layers 4, stripe third trenches D3 that reach the transparent electrode layers 3 are formed at positions different from the positions of the first trenches D1 and the second trenches (connection trenches) D2, thereby isolating the cells 1. In this manner, the transparent electrode layers 3 of the cells 1 are connected to the back-surface electrode layers 5 of the adjacent cells 1, thereby electrically connecting the adjacent cells 1 in series.

The transparent electrode layers 3 are configured by translucent films such as transparent conductive oxide films that contain zinc oxide (ZnO), indium tin oxide (ITO), tin oxide ($SnO_2$) and the like, or by films that are obtained by adding aluminum (Al) to these transparent conductive oxide films. The transparent electrode layers 3 can be a ZnO film, an ITO film, and an $SnO_2$ film that use as dopant at least one kind of element selected from aluminum (Al), gallium (Ga), indium (In), boron (B), yttrium (Y), silicon (Si), zirconium (Zr), and titanium (Ti), or can be transparent conductive films formed by laminating these films. Any transparent conductive films having light permeability can be the transparent electrode layers 3. The transparent electrode layers 3 have a surface texture structure such that irregularities 3a are formed on surfaces of these layers. The texture structure has a function of scattering incident sunlight and increasing light utilization efficiency in the photoelectric conversion layers 4.

Each of the photoelectric conversion layers 4 has a PN junction or a PIN junction, and is configured by laminating one or more thin-film semiconductor layers that generate electric power by incident light. In the present embodiment, the photoelectric conversion layer 4 is configured by a laminated film formed by laminating from a transparent electrode layer 3 side, a p-type hydrogenated microcrystalline silicon (μc-Si:H) layer as a first conductive semiconductor layer, an i-type hydrogenated microcrystalline silicon (μc-Si:H) layer as a second conductive semiconductor layer, and an n-type hydrogenated microcrystalline silicon (μc-Si:H) layer as a third conductive semiconductor layer. As for other types of the photoelectric conversion layer 4, for example, there can be a type configured by a laminated film formed by laminating from a transparent electrode layer 3 side, a p-type hydrogenated amorphous silicon carbide (a-SiC:H) layer as a first conductive semiconductor layer, an i-type hydrogenated amorphous silicon (a-Si:H) layer as a second conductive semiconductor layer, and an n-type hydrogenated microcrystalline silicon (μc-Si:H) layer as a third conductive semiconductor layer.

The photoelectric conversion layer 4 can be also configured by a two-stage PIN junction that includes a p-type hydrogenated amorphous silicon carbide (a-SiC:H) layer as a first conductive semiconductor layer, an i-type hydrogenated amorphous silicon (a-Si:H) layer as a second conductive semiconductor layer, an n-type hydrogenated microcrystalline silicon (μc-Si:H) layer as a third conductive semiconductor layer, a p-type hydrogenated microcrystalline silicon (μc-Si:H) layer as a first conductive semiconductor layer, an i-type hydrogenated microcrystalline silicon (μc-Si:H) layer as a second conductive semiconductor layer, and an n-type hydrogenated microcrystalline silicon (μc-Si:H) layer as a third conductive semiconductor layer. In the case of a tandem structure, the photoelectric conversion layer 4 can be configured in a tandem structure that has laminated thereon two or more layers of a unit photoelectric conversion layer, which has a first conductive semiconductor layer, a second conductive semiconductor layer, and a third conductive semiconductor layer laminated thereon. When the photoelectric conversion layer 4 is configured by laminating a plurality of thin-film semiconductor layers like the two-stage PIN junction described above, an electrical and optical connection between PIN junctions can be improved by inserting intermediate layers of microcrystalline silicon monoxide (μc-SiO) and aluminum-added zinc oxide (ZnO:Al) or the like between respective PIN junctions.

Each of the back-surface electrode layers 5 is patterned in a shape and at a position different from those of the photoelectric conversion layer 4. As shown in FIG. 1-2, each of the back-surface electrode layers 5 is configured by a transparent-conductive metal-compound layer 5a and a metal layer 5b. For example, tin oxide ($SnO_2$), zinc oxide (ZnO), and ITO, or a combination of these metals for the transparent-conductive metal-compound layer 5a can be used. Silver (Ag) or aluminum (Al) can be used for the metal layer 5b.

Further, oxide layers 7 having high insulation properties are formed as insulating regions on sidewall surfaces of the photoelectric conversion layers 4. The oxide layers 7 have an electric resistance value that is larger than an electric resistance value of the i-type hydrogenated microcrystalline silicon (μc-Si:H) layer as a second conductive semiconductor layer. When the photoelectric conversion layers 4 have a tandem structure, the oxide layers 7 have an electric resistance value that is larger than a maximum electric resistance value among electric resistance values of i-type amorphous semiconductor layers as second conductive semiconductor layers included in the photoelectric conversion layers 4.

When the oxide layers 7 are formed with intermediate layers as low-resistance layers made of transparent conductive films between PIN junctions of stages by laser processing, sidewall surfaces of the intermediate layers are also oxidized to become oxide layers having a high resistance.

When low-resistance layers are formed on sidewall surfaces of the third trenches (isolation trenches) D3 of the photoelectric conversion layers 4 and also when the low-resistance layers are in contact with the back-surface electrode layers 5, a current leakage (side leakage) from the transparent electrode layer 3 of a thin-film solar cell to the back-surface electrode layer 5 of this thin-film solar cell occurs, and this becomes a cause of degradation of photoelectric conversion efficiency. However, according to this module 10, the oxide layers 7 having high insulation properties are formed on the sidewall surfaces of the photoelectric conversion layers 4. Therefore, when intermediate layers as low-resistance layers made of transparent conductive films are formed between PIN junctions of a side leakage current, the sidewall surfaces of the intermediate layers are also oxidized to become oxide layers having a high resistance.

When low-resistance layers are formed on sidewall surfaces of the third trenches (isolation trenches) D3 of the photoelectric conversion layers 4 and also when the low-resistance layers are in contact with the back-surface electrode layers 5, a current leakage (side leakage) from the transparent electrode layer 3 of a thin-film solar cell to the back-surface electrode layers 5 of this thin-film solar cell occurs, and this becomes a cause of degradation of photoelectric conversion efficiency. However, according to this module 10, the oxide layers 7 having high insulation properties are formed on the sidewall surfaces of the photoelectric conversion layers 4. Accordingly, no sidewall leakage current flows, and thus degradation of photoelectric conversion efficiency can be prevented.

An outline of operation of the module 10 according to the first embodiment is explained. When sunlight is incident from a back surface (a surface on which the cells 1 are not formed) of the translucent insulating substrate 2, free carriers are generated on the photoelectric conversion layers 4, and a current is generated. The current generated in the cells 1 flows into adjacent cells 1 via the transparent electrode layers 3 and the back-surface electrode layers 5, and generates a power-generation current of the whole of the module 10.

According to the module 10 of the first embodiment configured as described above, because the module 10 includes the oxide layers 7 on the sidewall surfaces of the third trenches (isolation trenches) D3 of the photoelectric conversion layers 4, a current leakage (side leakage) from the transparent electrode layer 3 of one cell 1 to the back-surface electrode layer 5 of this cell 1 can be prevented, and no side leakage current flows from the transparent electrode layer 3 of one cell 1 to the back-surface electrode layer 5 of this cell 1. Therefore, according to the module 10 of the first embodiment, degradation of photoelectric conversion efficiency attributable to a side leakage on the sidewall surfaces of the third trenches (isolation trenches) D3 can be prevented, and a high-quality thin-film solar cell that can obtain high photoelectric conversion efficiency is achieved.

A method for manufacturing the module 10 according to the first embodiment configured as described above is explained next. FIGS. 2-1 to 2-8 are cross-sectional views for explaining an example of a manufacturing process of the module 10 according to the first embodiment, and these cross-sectional views correspond to FIG. 1-2.

First, the translucent insulating substrate 2 is prepared. In this example, flat white plate glass is used for the translucent insulating substrate 2. An $SiO_2$ film is formed for the undercoating layer 6 at one surface side of the translucent insulating substrate 2 by a sputtering method or the like. Next, a ZnO film is formed for a transparent conductive film 11 that becomes the transparent electrode layer 3 on the undercoating layer 6 by the sputtering method (FIG. 2-1). For materials that constitute the transparent conductive film 11, in addition to the ZnO film, there can be used transparent conductive oxide films of TIO, $SnO_2$ and the like, and films obtained by adding metals of Al and the like to these transparent conductive oxide films to improve electric conductivity. Other film forming methods such as a CVD method can be also used for the film forming method.

Thereafter, a surface of the transparent conductive film 11 is roughened by etching using dilute hydrochloric acid, thereby forming a small irregularity 3a on the surface of the transparent conductive film 11 (FIG. 2-2). However, when the transparent conductive film 11 of $SnO_2$, ZnO or the like is formed by a CVD method, an irregularity is formed on the surface of the transparent conductive film 11 by self-organization. Therefore, in this case, an irregularity does not need to be formed by etching using dilute hydrochloric acid.

Figures 1, 2:
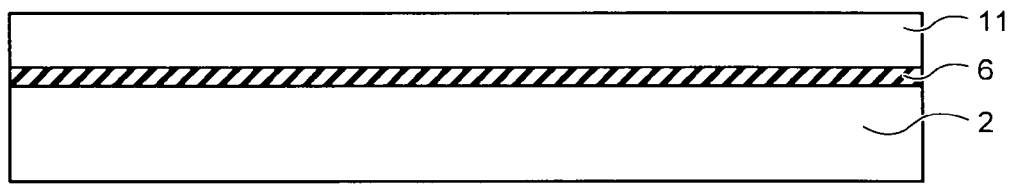
Figure 2:
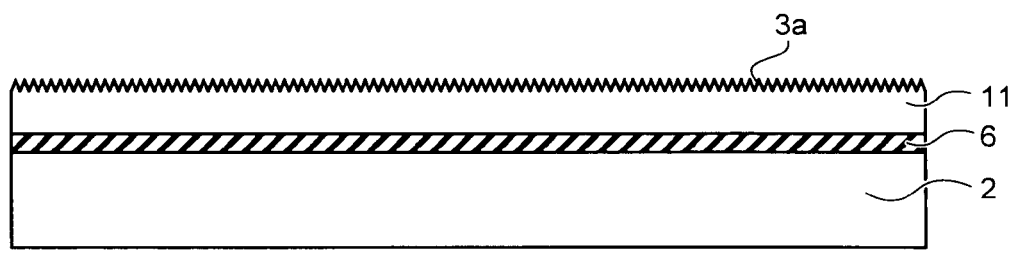
Figures 2, 3:
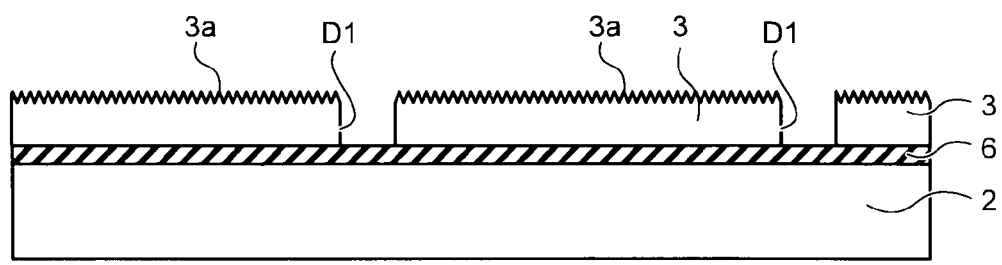

Next, the transparent electrode layer 3 is patterned in a reed shape by disconnecting and removing a part of the transparent electrode layer 3 in a stripe shape in a direction substantially parallel to the short direction of the translucent insulating substrate 2, thereby isolating the transparent electrode layer 3 into a plurality of transparent electrode layers 3 (FIG. 2-3). The transparent electrode layers 3 are patterned by forming the first trenches D1 in a stripe shape that are extended in a direction substantially parallel to the short direction of the translucent insulating substrate 2 and reach the translucent insulating substrate 2, by a laser scribing method. To obtain the transparent electrode layers 3 isolated from each other within a substrate surface on the translucent insulating substrate 2 in this manner, it is also possible to employ a method for etching by using a resist mask formed by photoengraving or the like or a method such as a deposition method that uses a metal mask.

Figures 2, 3, 4:
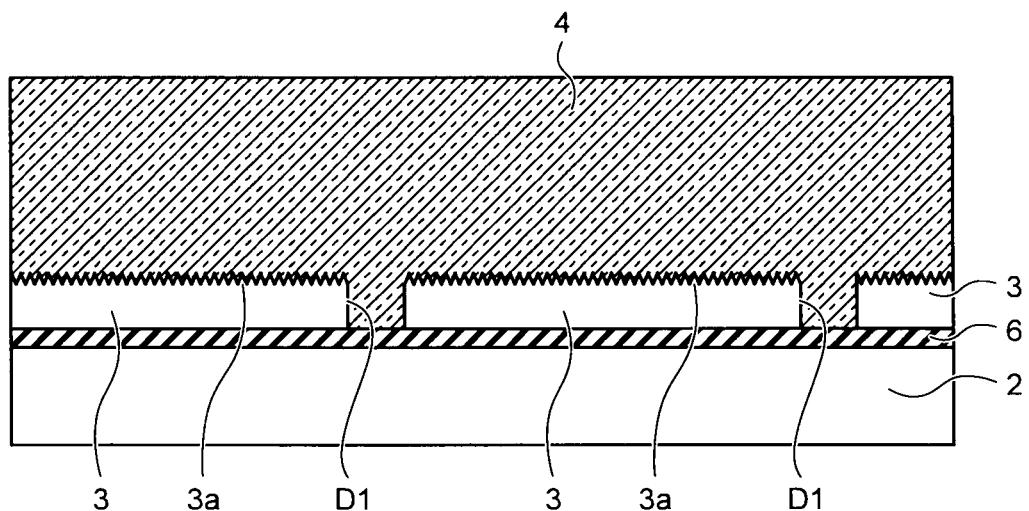

Next, the photoelectric conversion layer 4 is formed by a CVD method on the transparent electrode layers 3 that include the first trenches D1. In the present embodiment, a p-type hydrogenated microcrystalline silicon (μc-Si:H) layer, an i-type hydrogenated microcrystalline silicon (μc-Si:H) layer, and an n-type hydrogenated microcrystalline silicon (μc-Si:H) layer are formed for the photoelectric conversion layer 4 by sequentially laminating these layers from transparent electrode layers 3 sides (FIG. 2-4).

Next, the photoelectric conversion layer 4 formed by lamination in this manner is patterned by laser scribing in a similar manner to that applied to the transparent electrode layer 3 (FIG. 2-5). That is, the photoelectric conversion layer 4 is patterned in a reed shape by disconnecting and removing a part of the photoelectric conversion layer 4 in a stripe shape in a direction substantially parallel to the short direction of the translucent insulating substrate 2, thereby isolating the photoelectric conversion layers 4 into a plurality of photoelectric conversion layers 4. The patterning of the photoelectric conversion layer 4 is performed by a laser scribing method by forming the second trenches (connection trenches) D2 in a stripe shape that are extended in a direction substantially parallel to the short direction of the translucent insulating substrate 2 and reach the transparent electrode layers 3 at positions different from those of the first trenches D1. After the second trenches (connection trenches) D2 are formed, scattered objects adhered on the inside of the second trenches (connection trenches) D2 are removed by high-pressure water cleaning, megasonic cleaning, or brush cleaning.

Next, as for the back-surface electrode layers 5 on the photoelectric conversion layers 4 and in the second trenches (connection trenches) D2, the transparent-conductive metal-compound layers 5a made of tin oxide ($SnO_2$) are formed by vacuum deposition on the photoelectric conversion layers 4 (FIG. 2-6). Other film forming methods such as a CVD method can be used for the method for forming the transparent-conductive metal-compound layers 5a.

Next, as for the back-surface electrode layer 5, for example, a silver (Ag) film is formed as the metal layer 5b on the transparent-conductive metal-compound layers 5a by the sputtering method (FIG. 2-6). In this case, the metal layer 5b is formed in a condition that the metal layer 5b fills the second trenches D2. Other film forming methods such as a CVD method can be used for the method for forming the metal layer 5b.

After the transparent-conductive metal-compound layers 5a are formed, the back-surface electrode layer 5 and the photoelectric conversion layers 4 are patterned in a reed shape by disconnecting and removing a part of the back-surface electrode layer 5 and the photoelectric conversion layers 4 in a stripe shape in a direction substantially parallel to the short direction of the translucent insulating substrate 2, thereby isolating the back-surface electrode layer 5 and the photoelectric conversion layers 4 corresponding to plural cells 1 (FIG. 2-7). The patterning is performed by a laser scribing method by forming the third trenches (isolation trenches) D3 in a stripe shape that are extended in a direction substantially parallel to the short direction of the translucent insulating substrate 2 and reach the transparent electrode layers 3 at positions different from those of the first trenches D1 and the second trenches (connection trenches) D2. Because it is difficult to cause the back-surface electrode layer 5 having a high reflectance to directly absorb laser beams, the photoelectric conversion layers 4 are caused to absorb laser beam energy, and the back-surface electrode layer 5 and the photoelectric conversion layers 4 are locally blown off such that the back-surface electrode layer 5 and the photoelectric conversion layers 4 are isolated to correspond to the plural cells 1.

At the time of forming the third trenches (isolation trenches) D3 by laser processing, a residue due to the process of the photoelectric conversion layers 4 and silicon films of the photoelectric conversion layers 4 that are molten and crystallized to have a low resistance by laser beams are adhered on sidewall surfaces of the photoelectric conversion layers 4 in the third trenches (isolation trenches) D3, thereby forming low-resistance layers on the sidewall surfaces of the photoelectric conversion layers 4. More specifically, a residue of p-type hydrogenated microcrystalline silicon (μc-Si:H) layers as low-resistance layers, and i-type hydrogenated amorphous silicon (a-Si:H) layers that are molten and crystallized to have a low resistance by laser beams are adhered on the sidewall surfaces of the photoelectric conversion layers 4, thereby forming low-resistance layers on the sidewall surfaces of the photoelectric conversion layers 4.

When the low-resistance layer is in contact with the back-surface electrode layer 5, a current leakage (side leakage) from the transparent electrode layer 3 of one cell 1 to the back-surface electrode layer 5 of this transparent electrode layer 3 occurs, and this becomes a cause of degradation of photoelectric conversion efficiency. Therefore, when the low-resistance layers formed on the sidewall surfaces of the photoelectric conversion layers 4 are oxidized to have a high resistance after the third trenches (isolation trenches) D3 are formed, no side leakage current flows, and degradation of photoelectric conversion efficiency can be prevented.

According to the present embodiment, an oxidation process (a process of setting a high-resistance state) for oxidizing sidewalls of the photoelectric conversion layers 4 is performed after the third trenches (isolation trenches) D3 are formed by laser processing. The oxidation process (the process of setting a high-resistance state) is performed to form the oxide layers 7 by supplying oxygen plasma to the sidewalls of the photoelectric conversion layers 4 and by oxidizing the sidewalls of the photoelectric conversion layers 4 by a plasma process (FIG. 2-8). For example, the oxide layers 7 are formed by oxidizing the sidewalls of the photoelectric conversion layers 4 by exposing the whole of the module 10 to oxygen plasma. In this case, sidewalls substantially parallel to a longitudinal direction of the translucent insulating substrate 2 (sidewalls in a direction of a line B-B' in FIG. 1-1) are also oxidized among the sidewalls of the photoelectric conversion layers 4, thereby forming the oxide layers 7. The oxide layers 7 preferably have a film thickness of at least 10 nanometers or more to maintain sufficient insulation properties. According to the present embodiment, oxygen plasma that has high reactivity is used. Therefore, thick oxide layers can be easily formed. Instead of oxygen plasma, nitrogen plasma can be also used to form nitrided layers having a similar film thickness. Upper parts of the photoelectric conversion layers 4 are not oxidized because the upper parts are covered with the back-surface electrode layers 5. Accordingly, sidewalls of the photoelectric conversion layers 4 that are not covered with the back-surface electrode layers 5 are covered with the oxide layers 7 having high electrical insulation properties. When an etching gas is introduced into a plasma generating device to remove a residue present on sidewalls before an oxygen plasma process described above is performed, the oxidation process is more ensured, and this is desirable. Further, a leakage portion can be disconnected by applying a bias voltage to each cell before the oxidation process.

The oxide layers 7 have an electric resistance value that is larger than an electric resistance value of i-type hydrogenated microcrystalline silicon (μc-Si:H) layers as second conductive semiconductor layers in the photoelectric conversion layers 4. When the photoelectric conversion layers 4 have a tandem structure, the oxide layers 7 have an electric resistance value that is larger than a maximum electric resistance value among electric resistance values of i-type amorphous semiconductor layers as second conductive semiconductor layers included in the photoelectric conversion layers 4.

For the oxidation process, the oxide layers 7 can be formed by supplying a gas that contains ozone, particularly high concentration ozone, to the sidewalls of the photoelectric conversion layers 4 and by oxidizing the sidewalls of the photoelectric conversion layers 4, instead of using the oxygen plasma. For example, the oxide layers 7 can be formed by exposing the whole of the module 10 to a high-concentration ozone atmosphere. The oxide layers 7 can be formed at a relatively lower temperature than that when a normal thermal oxidation is performed, by forming the oxide layers 7 by a method for exposing the module 10 to the oxygen plasma or by a method for exposing the module 10 to a high-concentration ozone atmosphere. With this arrangement, the oxide layers 7 can be formed by suppressing negative influences to the photoelectric conversion layers 4 at the time of forming the oxide layers 7, for example, by suppressing heat influences on crystallization of the photoelectric conversion layers 4. The oxide layers 7 can be formed without using hazardous substances and the like.

By the above process, the module 10 according to the first embodiment that has the cells 1 as shown in FIGS. 1-1 and 1-2 can be completed.

As described above, according to the method for manufacturing a thin-film solar cell according to the first embodiment, the whole of the module 10 is exposed to oxygen plasma after the third trenches (isolation trenches) D3 are formed by laser processing. Alternatively, by exposing the whole of the module 10 to a high-concentration ozone atmosphere, the oxide layers 7 can be formed on the sidewalls of the third trenches (isolation trenches) D3 of the photoelectric conversion layers 4, and insulating regions can be formed on the sidewalls of the third trenches (isolation trenches) D3 of the photoelectric conversion layers 4. With this arrangement, the oxide layers 7 can be formed at a relatively lower temperature than that when a normal thermal oxidation is performed, and the oxide layers 7 can be easily formed and in high productivity by suppressing negative influences (heat influences) to the photoelectric conversion layers 4 at the time of forming the oxide layers 7. Therefore, according to the method for manufacturing a thin-film solar cell according to the first embodiment, a high-quality thin-film solar cell that can obtain high photoelectric conversion efficiency by preventing degradation of photoelectric conversion efficiency attributable to a side leakage on the sidewall surfaces of the third trenches (isolation trenches) D3 can be efficiently manufactured. Because the thin-film solar cell that has improved power generation efficiency is obtained, the thin-film solar cell can be made compact to obtain the same power-generation amount as that obtained conventionally.

The leakage current can be also reduced by forming oxide layers on the sidewalls of the photoelectric conversion layers of cells positioned at disconnection positions, by performing a similar oxidation process after the process of removing a part of cells at an external periphery of the module. According to a thin-film solar cell module, a part of cells at the external periphery of the module is disconnected and removed, to maintain insulation from outside. Because sidewalls of cells that are left out become low-resistance layers, the sidewalls are preferably oxidized in a similar manner to that applied to the third trenches (isolation trenches) D3. Specifically, a part of cells at an outermost periphery is removed by sandblasting or by laser processing. Thereafter, the cells are exposed to oxygen plasma or an ozone atmosphere. As a result, oxide layers are formed on sidewalls of photoelectric conversion layers positioned at the outermost periphery, and a side leakage can be suppressed.

Further, according to the method for manufacturing a thin-film solar cell according to the first embodiment, this method can be directly applied to a conventional device structure because a device structure is not required to be complex.

Although the module 10 of a single-cell thin-film solar cell is explained above, application of the present invention is not limited thereto. The present invention can be similarly applied to a tandem thin-film solar cell that uses amorphous silicon or microcrystalline silicon in semiconductor layers of the photoelectric conversion layers 4, so long as a solar cell is a thin-film solar cell.

Second Embodiment

FIG. 3 is an explanatory diagram of a cross-sectional structure of cells 21 that constitute a thin-film solar cell module 20 according to a second embodiment of the present invention in a short direction, and is a cross-sectional view of relevant parts along the line A-A' in FIG. 1-1. In FIG. 3, members of the thin-film solar cell module 20 identical to those of the module 10 according to the first embodiment are denoted by like reference letters or numerals and detailed explanations thereof will be omitted.

As shown in FIGS. 1-1 and 3, the module 20 according to the second embodiment includes plural reed-shaped (rectangular) cells 21 formed on the translucent insulating substrate 2, and has a structure that these cells 21 are electrically connected in series. As shown in FIG. 3, each of the cells 21 has a structure that has sequentially laminated the translucent insulating substrate 2, the transparent electrode layer 3 that becomes a first electrode layer and is formed on the translucent insulating substrate 2, the photoelectric conversion layer 4 as a thin-film semiconductor layer formed on the transparent electrode layer 3, and the back-surface electrode layer 5 that becomes a second electrode layer and is formed on the photoelectric conversion layer 4. As shown in FIG. 3, the undercoating layer 6 of silicon oxide (hereinafter, simply "$SiO_2$") is provided as an impurity inhibition layer on the translucent insulating substrate 2.

The transparent electrode layers 3 formed on the translucent insulating substrate 2 are formed with the stripe first trenches D1 that are extended in a direction substantially parallel to the short direction of the translucent insulating substrate 2 and reach the translucent insulating substrate 2. The photoelectric conversion layers 4 are embedded into portions of the first trenches D1. Accordingly, the transparent electrode layers 3 are formed in isolation between cells such that the transparent electrode layers 3 stride over adjacent cells 21.

Further, the photoelectric conversion layers 4 formed on the transparent electrode layers 3 are formed with the stripe second trenches (connection trenches) D2 that are extended in a direction substantially parallel to the short direction of the translucent insulating substrate 2 and reach the transparent electrode layers 3, at positions different from positions of the first trenches D1. The back-surface electrode layers 5 are embedded into portions of the second trenches (connection trenches) D2. As a result, the back-surface electrode layers 5 are connected to the transparent electrode layers 3. Because the transparent electrode layers 3 stride over adjacent cells 21, the back-surface electrode layer 5 of one of adjacent two cells is electrically connected to the other transparent electrode layer 3.

Furthermore, on the back-surface electrode layers 5 and the photoelectric conversion layers 4, the stripe third trenches D3 that reach the transparent electrode layers 3 are formed at positions different from the positions of the first trenches D1 and the second trenches (connection trenches) D2, thereby isolating the cells 21. In this manner, the transparent electrode layers 3 of the cells 21 are connected to the back-surface electrode layers 5 of the adjacent cells 21, thereby electrically connecting the adjacent cells 21 in series.

Oxide layers 27 having high insulation properties are formed as insulating regions on the sidewall surfaces of the photoelectric conversion layers 4. The oxide layers 27 have an electric resistance that is a value larger than an electric resistance value of i-type hydrogenated microcrystalline silicon (μc-Si:H) layers as second conductive semiconductor layers. When the photoelectric conversion layers 4 have a tandem structure, the oxide layers 27 have an electric resistance value that is larger than a maximum electric resistance value among electric resistance values of i-type amorphous semiconductor layers as second conductive semiconductor layers that are included in the photoelectric conversion layers 4.

These oxide layers 27 are oxide layers of which a resistance is made high by oxidizing low-resistance layers formed by adhesion to the sidewall surfaces of the photoelectric conversion layers 4, of a residue that is generated by the process of the photoelectric conversion layers 4 when forming the third trenches (isolation trenches) D3 by laser processing and silicon films of the photoelectric conversion layers 4 that are molten and crystallized by laser beams to have a low resistance. More specifically, the oxide layers 27 are the oxide layers that are caused to have a high resistance by oxidizing low-resistance layers formed due to adhesion to the sidewall surfaces of the photoelectric conversion layers 4 of a residue of p-type hydrogenated microcrystalline silicon (μc-Si:H) layers as low-resistance layers and i-type hydrogenated amorphous silicon (a-Si:H) layers that are molten and crystallized to have a low resistance by laser beams. When intermediate layers as low-resistance layers made of transparent conductive films are formed between two-stage PIN junctions, sidewall surfaces of these intermediate layers are also oxidized to provide high-resistance oxide layers.

When low-resistance layers are formed on sidewall surfaces of the third trenches (isolation trenches) D3 of the photoelectric conversion layers 4 and also when the low-resistance layers are in contact with the back-surface electrode layers 5, a current leakage (side leakage) from the transparent electrode layer 3 of one cell 21 to the back-surface electrode layer 5 of this cell occurs, and this becomes a cause of degradation of photoelectric conversion efficiency. However, according to this module 20, because the oxide layers 27 having high insulation properties are formed on the sidewall surfaces of the photoelectric conversion layers 4, a side leakage current does not flow, and thus degradation of photoelectric conversion efficiency can be prevented.

According to the module 20 of the second embodiment configured as described above, because the module 20 includes the oxide layers 27 on the sidewall surfaces of the third trenches (isolation trenches) D3 of the photoelectric conversion layers 4, a current leakage (side leakage) from the transparent electrode layer 3 of one cell 21 to the back-surface electrode layer 5 of this cell 21 can be prevented, and no side leakage current flows from the transparent electrode layer 3 of one cell 21 to the back-surface electrode layer 5 of this cell 21. Therefore, according to the module 20 of the second embodiment, degradation of photoelectric conversion efficiency attributable to a side leakage on the sidewall surfaces of the third trenches (isolation trenches) D3 can be prevented, and a high-quality thin-film solar cell that can obtain high photoelectric conversion efficiency is achieved.

A method for manufacturing the module 20 according to the second embodiment configured as described above is explained next. FIGS. 4-1 and 4-2 are cross-sectional views for explaining an example of a manufacturing process of the module 20 according to the second embodiment, and these cross-sectional views correspond to FIG. 3.

First, the undercoating layers 6, the transparent electrode layers 3, the photoelectric conversion layers 4, and the back-surface electrode layers 5 are formed on the translucent insulating substrate 2 in the same process as that shown in FIGS. 2-1 to 2-7 in the first embodiment (FIG. 4-1).

Next, an oxidation process (a process of setting a high-resistance state) for oxidizing sidewalls of the photoelectric conversion layers 4 is performed after the third trenches (isolation trenches) D3 are formed by laser processing. In the present embodiment, the oxidation process (the process of setting a high-resistance state) is performed to form the oxide layers 27 by oxidizing the sidewalls of the photoelectric conversion layers 4 by irradiating oxygen ion beams 28 on the whole of the module 20 (FIG. 4-2). In this case, the oxygen ion beams 28 are also irradiated on sidewalls substantially parallel to a longitudinal direction of the translucent insulating substrate 2 (sidewalls in a direction of the line B-B' in FIG. 1-1) among the sidewalls of the photoelectric conversion layers 4, thereby also oxidizing the sidewalls and forming the oxide layers 27. The oxide layers 27 preferably have a film thickness of at least 10 nanometers or more to maintain sufficient insulation properties. According to the present embodiment, ion beams having high reactivity are used. Therefore, thick oxide layers can be easily formed. Upper parts of the photoelectric conversion layers 4 are not oxidized because the upper parts are covered with the back-surface electrode layers 5. Accordingly, sidewalls of the photoelectric conversion layers 4 that are not covered with the back-surface electrode layers 5 are covered with the oxide layers 27 having high electrical insulation properties. Further, a leakage portion can be disconnected by applying a bias voltage to each cell before the oxidation process.

The oxide layers 27 have an electric resistance value that is larger than an electric resistance value of i-type hydrogenated microcrystalline silicon (μc-Si:H) layers as second conductive semiconductor layers in the photoelectric conversion layers 4. When the photoelectric conversion layers 4 have a tandem structure, the oxide layers 27 have an electric resistance value that is larger than a maximum electric resistance value among electric resistance values of i-type amorphous semiconductor layers as second conductive semiconductor layers included in the photoelectric conversion layers 4.

Figures 2, 3, 4, 5:
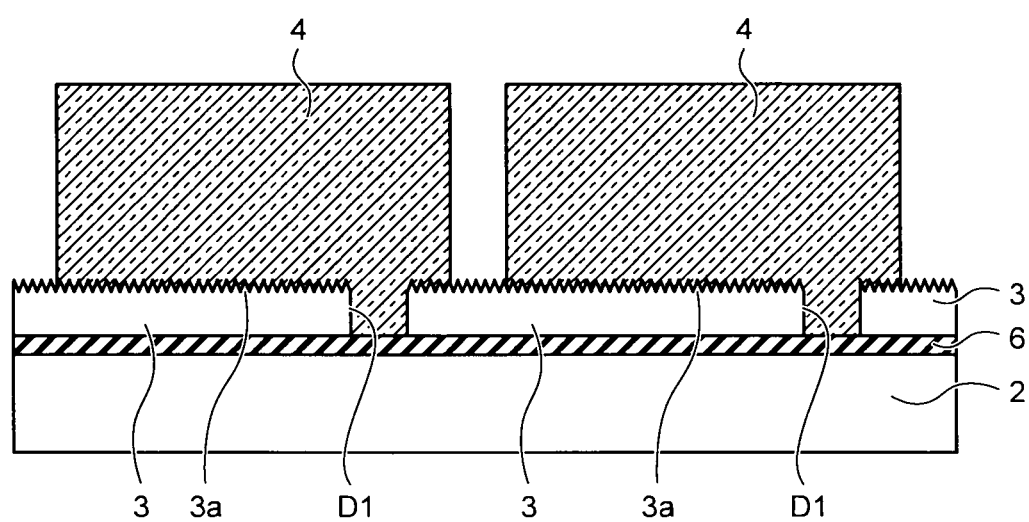

FIG. 5 is a schematic diagram for explaining a method for irradiating the oxygen ion beams 28 on the module 20 in a method for forming the oxide layers 27 according to the second embodiment. When the oxygen ion beams 28 are irradiated on the module 20, preferably, the oxygen ion beams 28 are irradiated on a formation surface 22 of the cells 21 in the module 20, that is, from a direction with an inclination by a predetermined angle (oblique direction) to an in-plane direction of the translucent insulating substrate 2, as shown in FIG. 5. Because the oxygen ion beams 28 have directivity, the oxygen ion beams 28 can be irradiated in high density on the sidewalls of the photoelectric conversion layers 4 by irradiating the oxygen ion beams 28 on the formation surface 22 of the cells 21 from the direction with an inclination by the predetermined angle, and thus the oxidation process can be efficiently performed.

By forming the oxide layers 27 by irradiating the oxygen ion beams 28 as described above, the oxide layers 27 can be formed at a relatively lower temperature than that when a normal thermal oxidation is performed. With this arrangement, the oxide layers 27 can be formed by suppressing negative influences to the photoelectric conversion layers 4 at the time of forming the oxide layers 27, for example, by suppressing heat influences on crystallization of the photoelectric conversion layers 4.

By the above process, the module 20 according to the second embodiment that has the cells 21 as shown in FIGS. 1-1 and 3 can be completed.

As described above, according to the method for manufacturing a thin-film solar cell according to the second embodiment, after the third trenches (isolation trenches) D3 are formed by laser processing, the oxygen ion beams 28 are irradiated on the whole of the module 20, thereby forming the oxide layers 27 on the sidewalls of the third trenches (isolation trenches) D3 of the photoelectric conversion layers 4 and forming insulating regions on the sidewalls of the third trenches (isolation trenches) D3 of the photoelectric conversion layers 4. With this arrangement, the oxide layers 27 can be formed at a relatively lower temperature than that when a normal thermal oxidation is performed, and the oxide layers 27 can be easily formed and in high productivity by suppressing negative influences (heat influences) to the photoelectric conversion layers 4 at the time of forming the oxide layers 27. Therefore, according to the method for manufacturing a thin-film solar cell according to the second embodiment, a high-quality thin-film solar cell that can obtain high photoelectric conversion efficiency by preventing degradation of photoelectric conversion efficiency attributable to a side leakage on the sidewall surfaces of the third trenches (isolation trenches) D3 can be efficiently manufactured.

The leakage current can be also reduced by forming oxide layers on the sidewalls of the photoelectric conversion layers of cells that are positioned at disconnection positions, by performing a similar oxidation process after the process of removing a part of cells at an external periphery of the module. According to a thin-film solar cell module, a part of cells at the external periphery of the module is disconnected and removed, to maintain insulation from outside. Because sidewalls of cells that are left out become low-resistance layers, the sidewalls are preferably oxidized in a similar manner to that applied to the third trenches (isolation trenches) D3. Specifically, a part of cells at an outermost periphery is removed by sandblasting or by laser processing. Thereafter, the cells are exposed to oxygen plasma or an ozone atmosphere. As a result, oxide layers are formed on sidewalls of photoelectric conversion layers positioned at the outermost periphery, and a side leakage can be suppressed.

Further, according to the method for manufacturing a thin-film solar cell according to the second embodiment, this method can be directly applied to a conventional device structure because a device structure is not required to be complex.

Although the module 20 of a single-cell thin-film solar cell is explained above, application of the present invention is not limited thereto. The present invention can be similarly applied to a tandem thin-film solar cell that uses amorphous silicon or microcrystalline silicon in semiconductor layers of the photoelectric conversion layers 4, so long as a solar cell is a thin-film solar cell.

Third Embodiment

Figures 2, 3, 4, 5, 6:
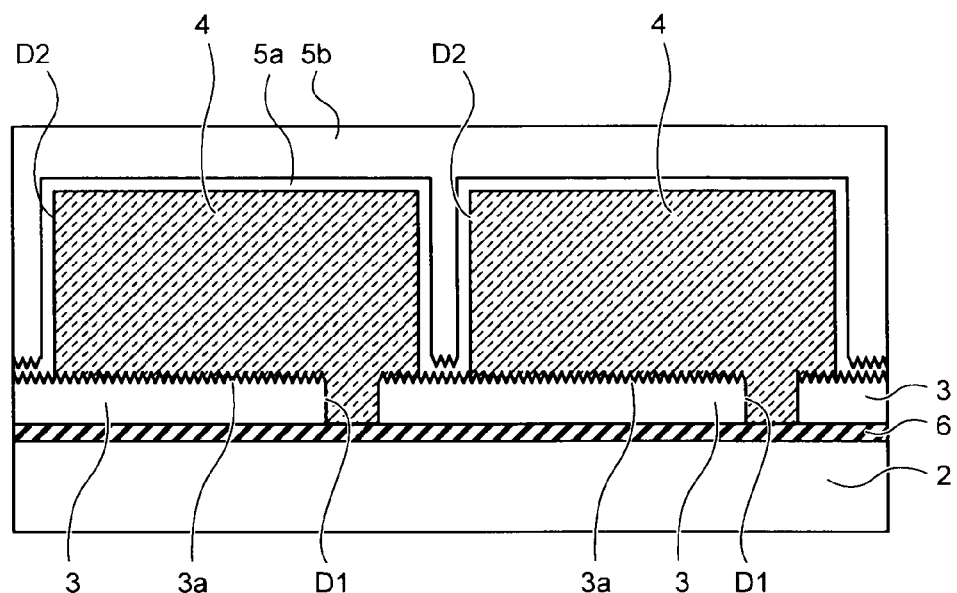

FIG. 6 is an explanatory diagram of a cross-sectional structure of cells 31 that constitute a thin-film solar cell module 30 according to a third embodiment of the present invention in a short direction, and is a cross-sectional view of relevant parts along the line A-A' in FIG. 1-1. In FIG. 6, members of the thin-film solar cell module 30 identical to those of the module 10 according to the first embodiment are denoted by like reference letters or numerals and detailed explanations thereof will be omitted.

As shown in FIGS. 1-1 and 6, the module 30 according to the third embodiment includes plural reed-shaped (rectangular) cells 31 formed on the translucent insulating substrate 2, and has a structure that these cells 31 are electrically connected in series. As shown in FIG. 6, each of the cells 31 has a structure that has sequentially laminated the translucent insulating substrate 2, the transparent electrode layer 3 that becomes a first electrode layer and is formed on the translucent insulating substrate 2, the photoelectric conversion layer 4 as a thin-film semiconductor layer formed on the transparent electrode layer 3, and the back-surface electrode layer 5 that becomes a second electrode layer and is formed on the photoelectric conversion layer 4. As shown in FIG. 6, the undercoating layer 6 of silicon oxide (hereinafter, simply "SiO$_2$") is provided as an impurity inhibition layer on the translucent insulating substrate 2.

The transparent electrode layers 3 formed on the translucent insulating substrate 2 are formed with the stripe first trenches D1 that are extended in a direction substantially parallel to the short direction of the translucent insulating substrate 2 and reach the translucent insulating substrate 2. The photoelectric conversion layers 4 are embedded into portions of the first trenches D1. Accordingly, the transparent electrode layers 3 are formed in isolation between cells such that the transparent electrode layers 3 stride over adjacent cells 31.

Further, the photoelectric conversion layers 4 formed on the transparent electrode layers 3 are formed with the stripe second trenches (connection trenches) D2 that are extended in a direction substantially parallel to the short direction of the translucent insulating substrate 2 and reach the transparent electrode layers 3, at positions different from positions of the first trenches D1. The back-surface electrode layers 5 are embedded into portions of the second trenches (connection trenches) D2. As a result, the back-surface electrode layers 5 are connected to the transparent electrode layers 3. Because the transparent electrode layers 3 stride over adjacent cells 31, the back-surface electrode layer 5 of one of adjacent two cells is electrically connected to the other transparent electrode layer 3.

Furthermore, on the back-surface electrode layers 5 and the photoelectric conversion layers 4, the stripe third trenches D3 that reach the transparent electrode layers 3 are formed at positions different from the positions of the first trenches D1 and the second trenches (connection trenches) D2, thereby isolating the cells 31. In this manner, the transparent electrode layers 3 of the cells 31 are connected to the back-surface electrode layers 5 of the adjacent cells 31, thereby electrically connecting the adjacent cells 31 in series.

Oxide layers 37 having high insulation properties are formed as insulating regions on the sidewall surfaces of the photoelectric conversion layers 4. The oxide layers 37 have an electric resistance value that is larger than an electric resistance value of i-type hydrogenated microcrystalline silicon (μc-Si:H) layers as second conductive semiconductor layers. When the photoelectric conversion layers 4 have a tandem structure, the oxide layers 37 have an electric resistance value that is larger than a maximum electric resistance value among electric resistance values of i-type amorphous semiconductor layers as second conductive semiconductor layers included in the photoelectric conversion layers 4.

These oxide layers 37 are oxide layers of which a resistance is made high by oxidizing low-resistance layers formed by adhesion to the sidewall surfaces of the photoelectric conversion layers 4, of a residue that is generated by the process of the photoelectric conversion layers 4 when forming the third trenches (isolation trenches) D3 by laser processing and silicon films of the photoelectric conversion layers 4 that are molten and crystallized by laser beams to have a low resistance. More specifically, the oxide layers 37 are the oxide layers that are caused to have a high resistance by oxidizing low-resistance layers formed due to adhesion to the sidewall surfaces of the photoelectric conversion layers 4 of a residue of p-type hydrogenated microcrystalline silicon (μc-Si:H) layers as low-resistance layers and i-type hydrogenated amorphous silicon (a-Si:H) layers that are molten and crystallized to have a low resistance by laser beams. When intermediate layers as low-resistance layers made of transparent conductive films are formed between two-stage PIN junctions, sidewall surfaces of these intermediate layers are also oxidized to provide high-resistance oxide layers.

When low-resistance layers are formed on sidewall surfaces of the third trenches (isolation trenches) D3 of the photoelectric conversion layers 4 and also when the low-resistance layers are in contact with the back-surface electrode layers 5, a current leakage (side leakage) from the transparent electrode layer 3 of one cell 31 to the back-surface electrode layer 5 of this cell occurs, and this becomes a cause of degradation of photoelectric conversion efficiency. However, according to this module 30, because the oxide layers 37 having high insulation properties are formed on the sidewall surfaces of the photoelectric conversion layers 4, a side leakage current does not flow, and thus degradation of photoelectric conversion efficiency can be prevented.

According to the module 30 of the third embodiment configured as described above, because the module 30 includes the oxide layers 37 on the sidewall surfaces of the third trenches (isolation trenches) D3 of the photoelectric conversion layers 4, a current leakage (side leakage) from the transparent electrode layer 3 of one cell 31 to the back-surface electrode layer 5 of this cell 31 can be prevented, and no side leakage current flows from the transparent electrode layer 3 of one cell 31 to the back-surface electrode layer 5 of this cell 31. Therefore, according to the module 30 of the third embodiment, degradation of photoelectric conversion efficiency attributable to a side leakage on the sidewall surfaces of the third trenches (isolation trenches) D3 can be prevented, and a high-quality thin-film solar cell that can obtain high photoelectric conversion efficiency is achieved.

Figures 2, 3, 4, 5, 6, 7:
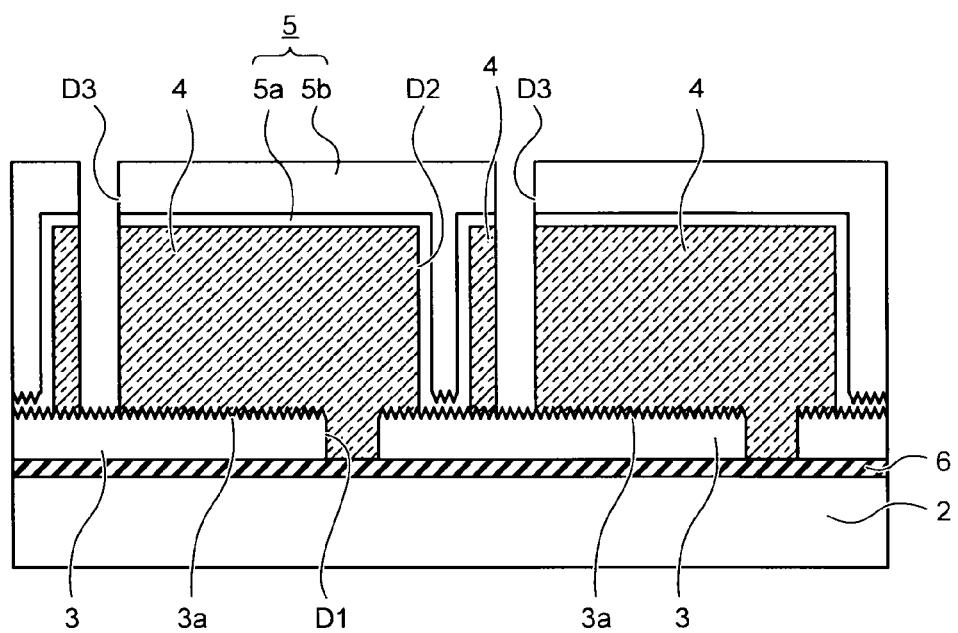
Figures 2, 3, 4, 5, 6, 7, 8:
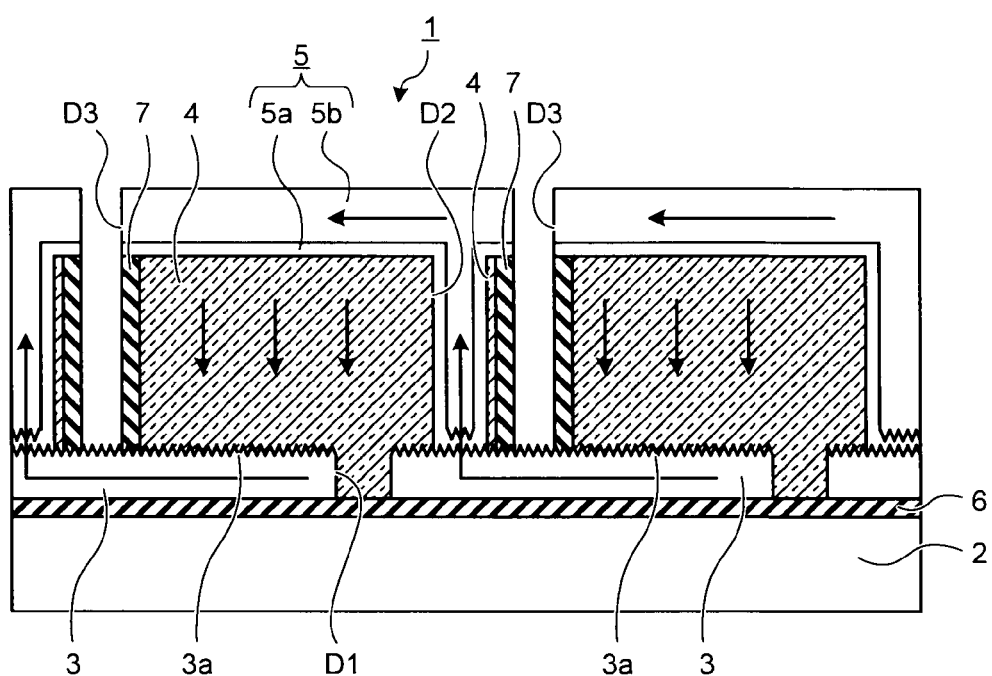
Figure 3:
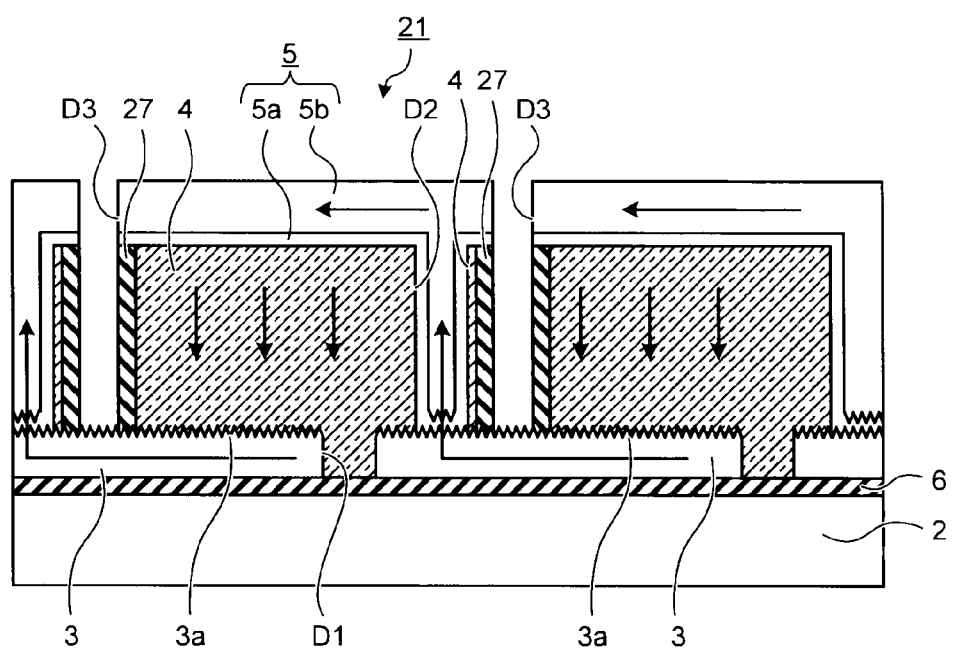
Figures 1, 4:
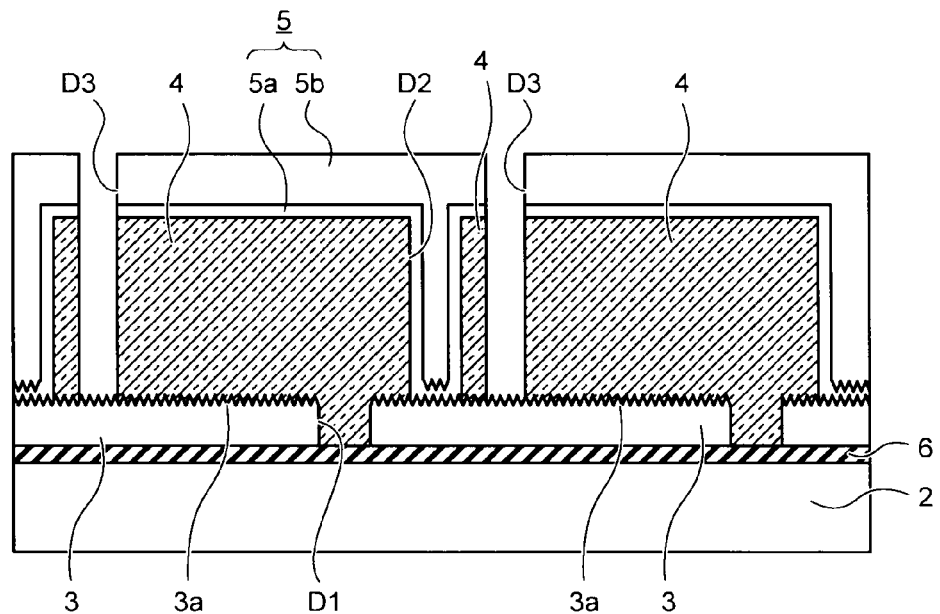
Figures 2, 4:
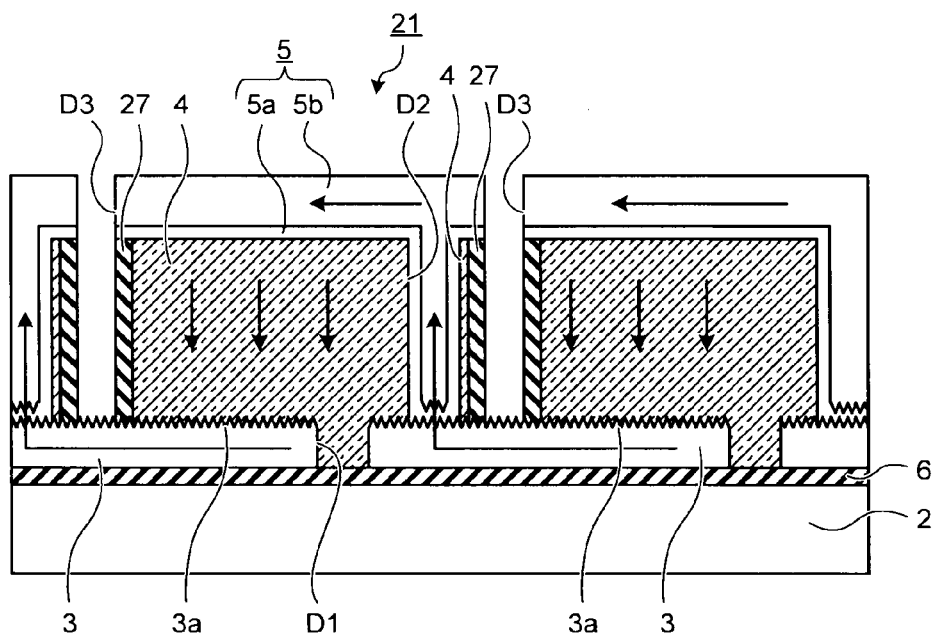
Figure 5:
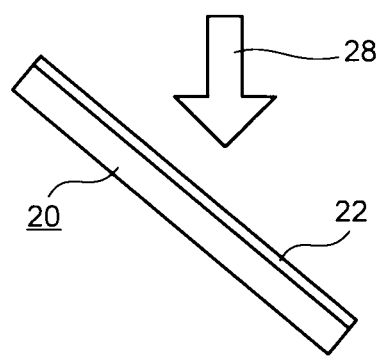
Figure 6:
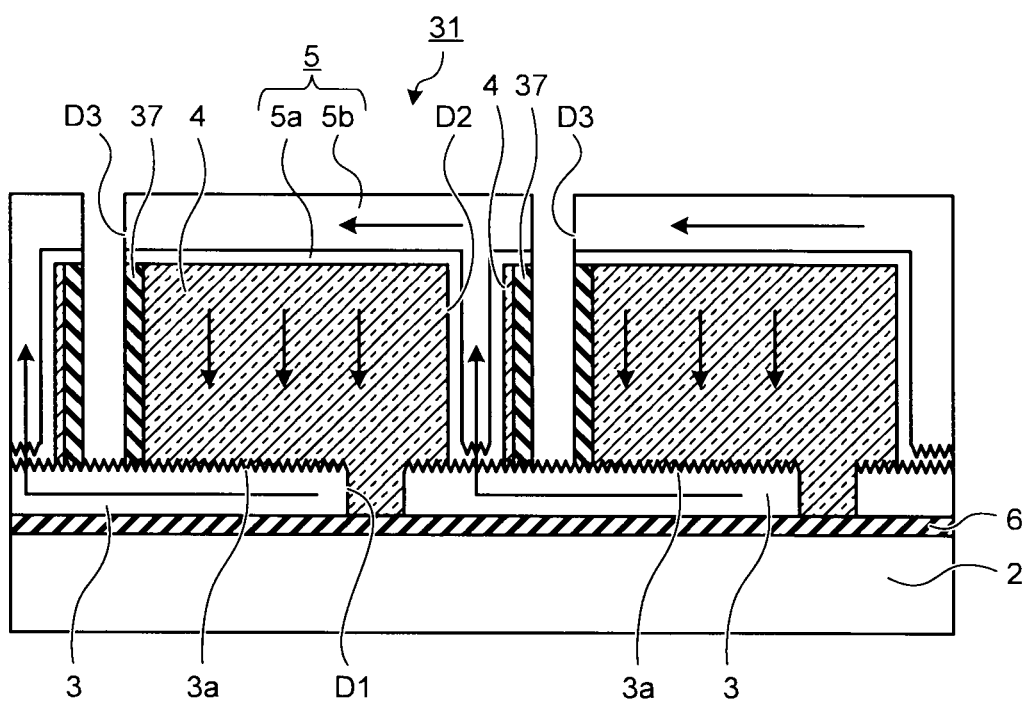
Figures 1, 7:
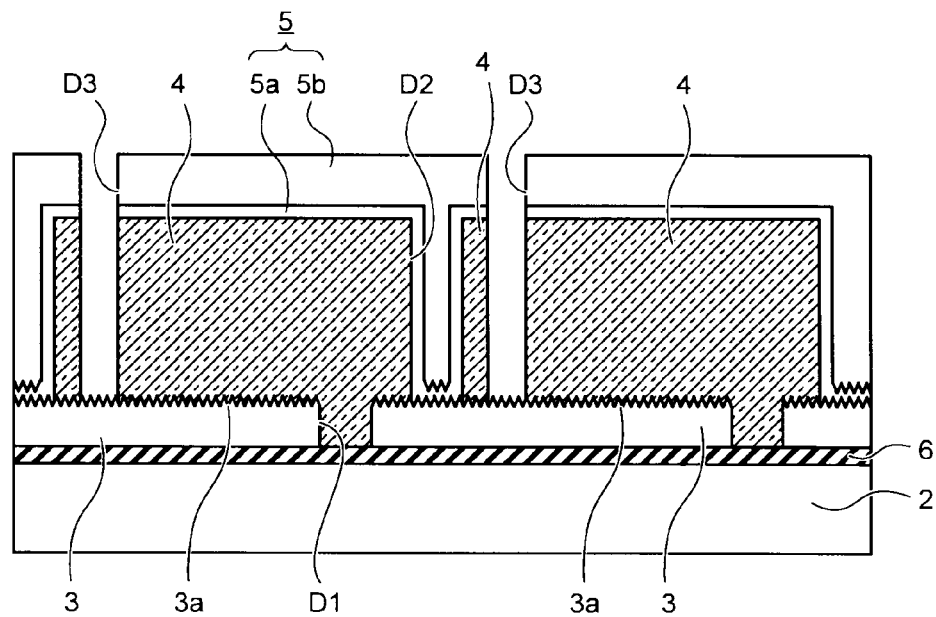
Figures 2, 7:
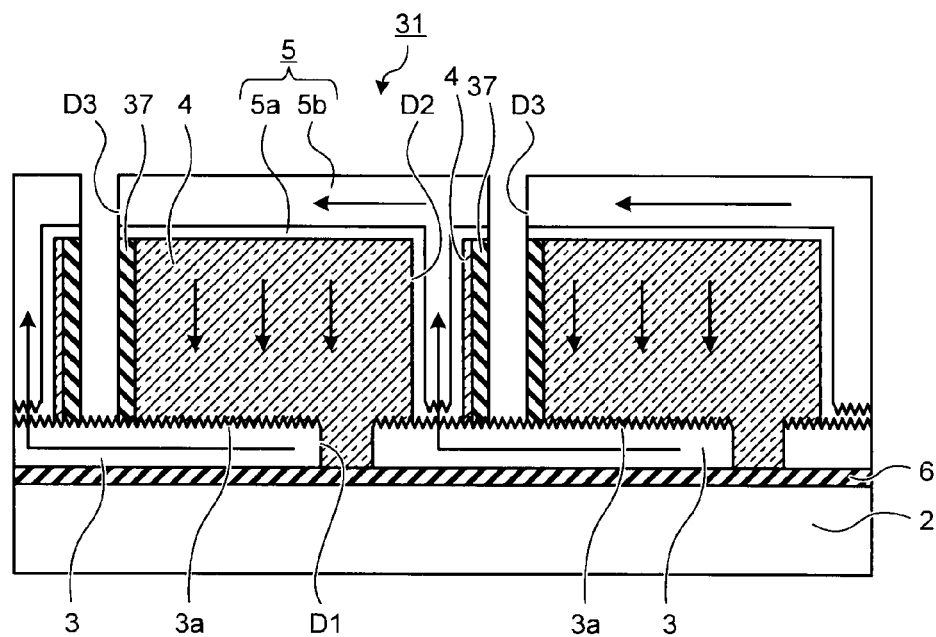

A method for manufacturing the module 30 according to the third embodiment configured as described above is explained next. FIGS. 7-1 and 7-2 are cross-sectional views for explaining an example of a manufacturing process of the module 30 according to the third embodiment, and these cross-sectional views correspond to FIG. 6.

First, the undercoating layers 6, the transparent electrode layers 3, the photoelectric conversion layers 4, and the back-surface electrode layers 5 are formed on the translucent insulating substrate 2 in the same process as that shown in FIGS. 2-1 to 2-7 in the first embodiment (FIG. 7-1).

Next, an oxidation process (a process of setting a high-resistance state) for oxidizing sidewalls of the photoelectric conversion layers 4 is performed after the third trenches (isolation trenches) D3 are formed by laser processing. In the present embodiment, a process of irradiating ultraviolet rays is performed before the oxidation process (the process of setting a high-resistance state). A residue at a process time is removed by irradiating ultraviolet rays on the whole of the module 30, and thereafter the sidewalls of the photoelectric conversion layers 4 are oxidized by a plasma process or ozone irradiation, thereby forming the oxide layers 37 (FIG. 7-2). Because the photoelectric conversion layers 4 become at a high temperature at the time of laser processing, an impurity present in a processing atmosphere is adhered on a processing surface. As a result, this hinders the oxidation process. Accordingly, it is desirable to remove the residue such as an impurity before the oxidation process. To maintain sufficient insulation properties, the oxide layers 37 preferably have a film thickness of at least 10 nanometers or more. In the present embodiment, sidewall surfaces become reaction-active by the irradiation of ultraviolet rays, and therefore thick oxide layers can be easily formed. Instead of oxygen plasma, nitrogen plasma can be also used to form nitrided layers having a similar film thickness. In this case, ultraviolet rays are also irradiated on sidewalls substantially parallel to a longitudinal direction of the translucent insulating substrate 2 (sidewalls in a direction of the line B-B' in FIG. 1-1) among the sidewalls of the photoelectric conversion layers 4, thereby also oxidizing the sidewalls and forming the oxide layers 37. Upper parts of the photoelectric conversion layers 4 are not oxidized because the upper parts are covered with the back-surface electrode layers 5. Accordingly, sidewalls of the photoelectric conversion layers 4 that are not covered with the back-surface electrode layers 5 are covered with the oxide layers 37 having high electrical insulation properties. Further, a leakage portion can be disconnected by applying a bias voltage to each cell before the oxidation process.

The oxide layers 37 have an electric resistance value that is larger than an electric resistance value of i-type hydrogenated microcrystalline silicon (μc-Si:H) layers as second conductive semiconductor layers in the photoelectric conversion layers 4. When the photoelectric conversion layers 4 have a tandem structure, the oxide layers 37 have an electric resistance value that is larger than a maximum electric resistance value among electric resistance values of i-type amorphous semiconductor layers as second conductive semiconductor layers included in the photoelectric conversion layers 4.

After the irradiation of ultraviolet rays, the oxide layers 37 are formed by exposing the module to oxygen plasma or a high-concentration ozone atmosphere. Accordingly, the oxide layers 37 having a sufficient film thickness can be formed at a relatively lower temperature than that when a normal thermal oxidation is performed. Consequently, the oxide layers 37 can be formed by suppressing negative influences to the photoelectric conversion layers 4 at the time of forming the oxide layers 37, for example, by suppressing heat influences such as crystallization of the photoelectric conversion layers 4.

By the above process, the module 30 according to the third embodiment that has the cells 31 as shown in FIGS. 1-1 and 6 can be completed.

As described above, according to the method for manufacturing a thin-film solar cell according to the third embodiment, after the third trenches (isolation trenches) D3 are formed by laser processing, ultraviolet rays are irradiated on the whole of the module 30, and thereafter the module 30 is exposed to oxygen plasma or a high-concentration ozone atmosphere, thereby forming the oxide layers 37 on the sidewalls of the third trenches (isolation trenches) D3 of the photoelectric conversion layers 4 and forming insulating regions on the sidewalls of the third trenches (isolation trenches) D3 of the photoelectric conversion layers 4. With this arrangement, the oxide layers 37 can be formed at a relatively lower temperature than that when a normal thermal oxidation is performed, and the oxide layers 37 can be easily formed and in high productivity by suppressing negative influences (heat influences) to the photoelectric conversion layers 4 at the time of forming the oxide layers 37. Therefore, according to the method for manufacturing a thin-film solar cell according to the third embodiment, a high-quality thin-film solar cell that can obtain high photoelectric conversion efficiency by preventing degradation of photoelectric conversion efficiency attributable to a side leakage on the sidewall surfaces of the third trenches (isolation trenches) D3 can be efficiently manufactured.

The leakage current can be also reduced by forming oxide layers on the sidewalls of the photoelectric conversion layers of cells positioned at disconnection positions, by performing an oxidation process similar to a method described in any of the embodiments described above after the process of removing a part of cells at an external periphery of the module. According to a thin-film solar cell module, a part of cells at the external periphery of the module is disconnected and removed, to maintain insulation from outside. Because sidewalls of cells that are left out become low-resistance layers, the sidewalls are preferably oxidized in a similar manner to that applied to the third trenches (isolation trenches) D3. Specifically, a part of cells at an outermost periphery is removed by sandblasting or by laser processing. Thereafter, the cells are irradiated with ultraviolet rays, and are exposed to oxygen plasma or an ozone atmosphere. As a result, a residue on the sidewalls of the photoelectric conversion layers positioned at the outermost periphery is removed, and a side leakage can be suppressed. The process of the oxidation process of isolation trenches can be performed after the sidewalls are formed at an external periphery by removing a part of cells at the external periphery. The process becomes simple when the isolation trenches and the sidewalls at the external periphery are oxidized after the sidewalls at the external periphery are formed.

Further, according to the method for manufacturing a thin-film solar cell according to the third embodiment, this method can be directly applied to a conventional device structure because a device structure is not required to be complex.

Although the module 30 of a single-cell thin-film solar cell is explained above, application of the present invention is not limited thereto. The present invention can be similarly applied to a tandem thin-film solar cell that uses amorphous silicon or microcrystalline silicon in semiconductor layers of the photoelectric conversion layers 4, so long as a solar cell is a thin-film solar cell.

Furthermore, the irradiation process of ultraviolet rays described above can be also applied to a case described in the second embodiment that after the third trenches (isolation trenches) D3 are formed by laser processing, the oxygen ion beams 28 are irradiated on the whole of the module 20, thereby forming the oxide layers 27 on the sidewalls of the third trenches (isolation trenches) D3 of the photoelectric conversion layers 4 and forming insulating regions on the sidewalls of the third trenches (isolation trenches) D3 of the photoelectric conversion layers 4. That is, ultraviolet rays are irradiated on the whole of the module after the third trenches (isolation trenches) D3 are formed, and thereafter oxygen ion beams are irradiated on the whole of the module, thereby forming the oxide layers 27 on the sidewalls of the third trenches (isolation trenches) D3 of the photoelectric conversion layers 4 and forming insulating regions on the sidewalls of the third trenches (isolation trenches) D3 of the photoelectric conversion layers 4. Also in this case, the effects described above can be obtained.

INDUSTRIAL APPLICABILITY

As described above, the method for manufacturing a thin-film photoelectric conversion device according to the present invention is useful for manufacturing a thin-film photoelectric conversion device in which a side leakage on sidewall surfaces of isolation trenches is prevented and capable of having improved photoelectric conversion efficiency.

REFERENCE SIGNS LIST

1 THIN-FILM SOLAR BATTERY CELL (CELL)
2 TRANSLUCENT INSULATING SUBSTRATE (GLASS SUBTRUCTURE)
3 TRANSPARENT ELECTRODE LAYER
3a IRREGULARITY
4 PHOTOELECTRIC CONVERSION LAYER
5 BACK-SURFACE ELECTRODE LAYER
5a TRANSPARENT-CONDUCTIVE METAL-COMPOUND LAYER
5b METAL LAYER
6 UNDERCOATING LAYER
7 OXIDE LAYER
10 THIN-FILM SOLAR CELL MODULE (MODULE)
11 TRANSPARENT CONDUCTIVE FILM
20 THIN-FILM SOLAR CELL MODULE (MODULE)
21 THIN-FILM SOLAR BATTERY CELL (CELL)
22 FORMATION SUFACE OF CELLS
27 OXIDE LAYER
28 OXYGEN ION BEAM
30 THIN-FILM SOLAR CELL MODULE (MODULE)
31 THIN-FILM SOLAR BATTERY CELL (CELL)
37 OXIDE LAYER
D1 FIRST TRENCH
D2 SECOND TRENCH (CONNECTION TRENCH)
D3 THIRD TRENCH (ISOLATION TRENCH)

The invention claimed is:

1. A method for manufacturing a thin-film photoelectric conversion device, the method comprising:
a first step of forming a first electrode layer, a photoelectric conversion layer having a first conductive semiconductor layer, a second conductive semiconductor layer, and a third conductive semiconductor layer sequentially laminated thereon, and a second electrode layer sequentially laminated in this order on a translucent insulating substrate, such that adjacent thin-film photoelectric conversion cells are electrically connected in series;
a second step of isolating a thin-film photoelectric conversion cell into a plurality of thin-film photoelectric conversion cells by forming isolation trenches that reach from a surface of the second electrode layer to the first electrode layer;
after the second step, a third step of removing a part of sidewalls at an external periphery of the thin-film photoelectric conversion cells positioned at an external peripheral edge of the thin-film photoelectric conversion device, along with an external periphery of the thin-film photoelectric conversion device, and maintaining isolation from the outside; and
a fourth step of modifying into insulation layers by performing an oxidation process on all of the sidewalls of the isolation trenches of the photoelectric conversion layer and all of the sidewalls at the external periphery after the third step.

2. The method for manufacturing a thin-film photoelectric conversion device according to claim 1, wherein the third step includes removing a part of the thin-film photoelectric conversion cells by sandblasting.

3. The method for manufacturing a thin-film photoelectric conversion device according to claim 1, wherein the oxidation process is performed by supplying oxygen plasma.

4. The method for manufacturing a thin-film photoelectric conversion device according to claim 1, wherein the oxidation process is performed by supplying a gas that contains ozone.

5. The method for manufacturing a thin-film photoelectric conversion device according to claim 1, wherein the oxidation process is performed by irradiating oxygen ion beams.

6. The method for manufacturing a thin-film photoelectric conversion device according to claim 5, wherein the oxygen ion beams are irradiated on an in-plane direction of the translucent insulating substrate from an oblique direction.

7. The method for manufacturing a thin-film photoelectric conversion device according to claim 3, wherein a process of irradiating ultraviolet rays is performed before the oxidation process.

8. The method for manufacturing a thin-film photoelectric conversion device according to claim 1, wherein the photoelectric conversion layer is a unit photoelectric-conversion layer having the first conductive semiconductor layer, the second conductive semiconductor layer, and the third conductive semiconductor layer laminated thereon.

9. The method for manufacturing a thin-film photoelectric conversion device according to claim 1, wherein the photoelectric conversion layer has a tandem structure that is formed by laminating, either directly or via intermediate layers that are made of transparent conductive films, a plurality of a unit photoelectric-conversion layer having the first conductive semiconductor layer, the second conductive semiconductor layer, and the third conductive semiconductor layer laminated thereon.

10. The method for manufacturing a thin-film photoelectric conversion device according to claim 1, wherein the photoelectric conversion layer is a silicon layer, and the insulation layer is a silicon-oxide film layer.

11. The method for manufacturing a thin-film photoelectric conversion device according to claim 4, wherein a process of irradiating ultraviolet rays is performed before the oxidation process.

12. The method for manufacturing a thin-film photoelectric conversion device according to claim 5, wherein a process of irradiating ultraviolet rays is performed before the oxidation process.

13. The method for manufacturing a thin-film photoelectric conversion device according to claim 1, wherein
in the third step, sidewalls at an external periphery of the thin-film photoelectric conversion cells in a extending direction of the isolation trenches are included in the part removed, and
in the fourth step, an entire periphery of the sidewalls of the photoelectric conversion layer of the thin-film photoelectric conversion cells are modified into the insulation layers.

* * * * *